United States Patent

[11] 3,584,265

[72] Inventor Johannes Nier
Stuttgart-Weilimdorf, Germany
[21] Appl. No. 757,407
[22] Filed Sept. 4, 1968
[45] Patented June 8, 1971
[73] Assignee Robert Bosch GmbH
Stuttgart, Germany
[32] Priority Sept. 12, 1967
[33] Germany
[31] P 15 89 543.9

[54] SEMICONDUCTOR HAVING SOFT SOLDERED CONNECTIONS THERETO
10 Claims, 4 Drawing Figs.

[52] U.S. Cl. 317/234
[51] Int. Cl. H01l 11/14
[50] Field of Search 317/234.5, 5.4, 6, 236, 234.3, 234.4, 234.5, 234.6, 1, 1.5, 1.51, 2, 3.1

[56] References Cited

UNITED STATES PATENTS

| | | | |
|---|---|---|---|
| 3,403,307 | 9/1968 | Rindner | 317/235 |
| 3,413,145 | 11/1968 | Robinson et al. | 117/201 |
| 3,429,980 | 2/1969 | Gottmann | 174/52 |
| 3,161,811 | 12/1964 | Brown | 317/234 |
| 3,381,081 | 4/1968 | Schalliol | 174/68.5 |
| 2,595,497 | 5/1952 | Webster, Jr. | 317/235 |
| 3,390,450 | 7/1968 | Checki, Jr. et al. | 29/589 |
| 3,296,506 | 1/1967 | Steinmetz et al. | 317/234 |

FOREIGN PATENTS

| | | | |
|---|---|---|---|
| 842,957 | 8/1960 | Great Britain | 317/235 |

*Primary Examiner*—John W. Huckert
*Attorney*—Michael S. Striker

ABSTRACT: A transistor wherein the collector contact of a platelike semiconductor of silicon is soldered to a metallic base and wherein the base carries two insulated terminals for coiled first end portions of two wirelike leads whose second end portions are soldered to the base and emitter contacts on the exposed surface of the semiconductor. The second end portion of the leads are parallel to the axes of coiled end portions and the internal diameters of such coiled end portions exceed the diameters of corresponding terminals. The connections between the terminals and the coiled end portions are established by solder which is applied over the coiled end portions in the form of annuli and melts while the parts of the transistor are conveyed through a soldering furnace. During such transport, the second end portions penetrate into soft solder of the base and emitter contacts, and the collector contact of the semiconductor is simultaneously soldered to the metallic base.

PATENTED JUN 8 1971 3,584,265

Johannes Nier
*INVENTOR*

BY Michael S. Striker

SEMICONDUCTOR HAVING SOFT SOLDERED CONNECTIONS THERETO

BACKGROUND OF THE INVENTION

The present invention relates to transistors and to a method of assembling the components of transistors. More particularly, the invention relates to improvements in transistors of the type wherein a semiconductor which contains a transistor system or an integrated circuit has one of its sides soldered to a metallic base and wherein the exposed other side of the semiconductor comprises two or more mutually insulated areas which must be electrically connected to terminals provided on and electrically insulated from the metallic base.

In presently known power amplifier transistors, the collector is secured to the metallic base by means of soft solder on the lead basis. The base and emitter contacts of the semiconductor are connected with slightly elastic wires or leads consisting of bronze or a similar alloy. The leads are clamped to postlike terminals on the metallic base and are mounted in prestressed condition so that innate resiliency urges the free end of each lead against the semiconductor. A drawback of such transistors is that the bias of each lead upon the semiconductor is not the same so that the semiconductor is likely to tilt during soldering. Such tilting of the semiconductor with reference to the metallic base results in the formation of a wedgelike collector layer between the base and the adjoining surface of the semiconductor. This is due to the fact that the leads are clamped to their terminals and that the initial stressing of the thus clamped leads and their bias upon the semiconductor cannot be selected with requisite accuracy. As stated above, unequal stressing of the semiconductor causes the latter to turn or tilt during soldering when the layer of solder between the semiconductor and the metallic base melts. Adjustment of leads which are clamped to the terminals prior to soldering to the semiconductor necessitates the use of magnifying glasses and/or microscopes and normally entails permanent deformation of leads and/or terminals. The situation is further aggravated when the contacts on the semiconductors are very small so that the leads must be clamped to their terminals with utmost precision in order to insure that the free ends of the thus clamped leads will actually engage with and will be soldered to corresponding contacts on the semiconductor.

SUMMARY OF THE INVENTION

It is an object of the present invention to provide a novel and improved method of assembling the components of transistors, particularly of connecting the leads to terminals on a metallic base and to contacts on a semiconductor which is to be secured to such base.

Another object of the invention is to provide a method according to which the leads need not be clamped to their terminals prior to connection of their ends with corresponding contacts on the semiconductor.

A further object of the invention is to provide novel leads which can be utilized in transistors to establish electrical connections between contacts on the semiconductor and terminals on the metallic base for the semiconductor.

An additional object of the invention is to provide a method of assembling the components of semiconductors which can be carried out by resorting to unskilled labor.

The method of my invention is utilized for assembling the components of a transistor wherein a coiled end portion of a metallic wirelike lead surrounds a metallic terminal and is bonded thereto by soft solder. The method comprises the steps of applying an annulus of soft solder of the annulus of soft solder preferably exceeds the diameter of the coiled end portion of the lead on the terminal so that the annulus overlies the coiled portion, and thereupon heating the annulus to melting temperature so that the material of the annulus melts and bonds the coiled end portion to the terminal. The melting step is preferably carried out in vacuo or in a protective atmosphere of inert gas while the components of the transistor are caused to move through a soldering furnace. The internal diameter of the annulas of soft solder preferably exceeds the diameter of the terminal prior to the melting step so that the annulus rests on the coiled end portion by gravity.

The components of the transistor further include a preferably platelike semiconductor of silicon carrying at least one contact of soft solder which is connected with a straight second end portion of the lead in the course of the melting step. The second end portion of the lead can be coated with a layer of soft solder prior to applying the coiled end portion around the terminal.

The novel features which are considered as characteristic of the invention are set forth in particular in the appended claims. The improved transistor itself, however, both as to its construction and its mode of operation, together with additional features and advantages thereof, will be best understood upon perusal of the following detailed description of certain specific embodiments with reference to the accompanying drawing.

DESCRIPTION OF THE PREFERRED EMBODIMENTS

Figure 1:
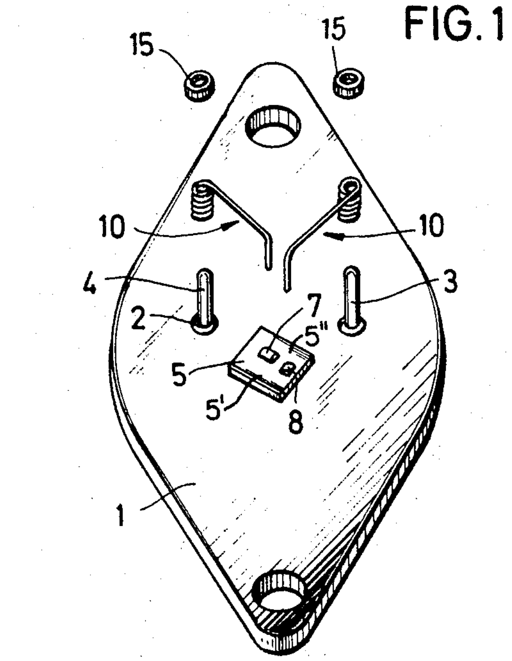
FIG. 1 is an exploded perspective view of a transistor prior to soldering of its leads to the terminals and to the semiconductor.

FIG. 1 illustrates the components of a transistor which embodies one form of the invention. These components include a platelike base 1 of metal which supports two pin-shaped terminals 3, 4 sealed therein by way of insulators 2 consisting of vitreous material with the terminals 3, 4 projecting beyond the top surface 1' of the base. A platelike semiconductor 5 of silicon has one of its bottom or first surface 5' coated with soft solder on lead basis i.e. containing a high percentage of lead and the solder-coated surface is provided with a collector contact and rests on the base 1 to be soldered thereto in a manner which will be described later. The exposed or second surface 5 of the semiconductor 5 is provided with a substantially centrally located emitter contact 7 and with a base contact 8 which is adjacent to one edge of the semiconductor. Each of the contacts 7, 8 includes a relatively thick layer of soft solder on the lead basis.

The leads which respectively connect the contacts 7, 8 with the terminals 4, 3 comprise two wirelike U-shaped conductors 10 which preferably consist of or include a high percentage of silver. The diameters of the leads 10 depend on the anticipated current strength and are in the range of one or more tenths of a millimeter. However, the leads can also be made of other metallic material which is a good conductor of electric current and can be readily deformed as well as bonded to terminals 3, 4 and contacts 7, 8 by means of soft solder. Also, the characteristics of metals or alloys of which the leads 10 consist should be such that they do not adversely affect the electrical properties of the semiconductor 5, either during soldering or when the transistor is in use, for example, due to evaporation or diffusion of atoms.

Figure 3:
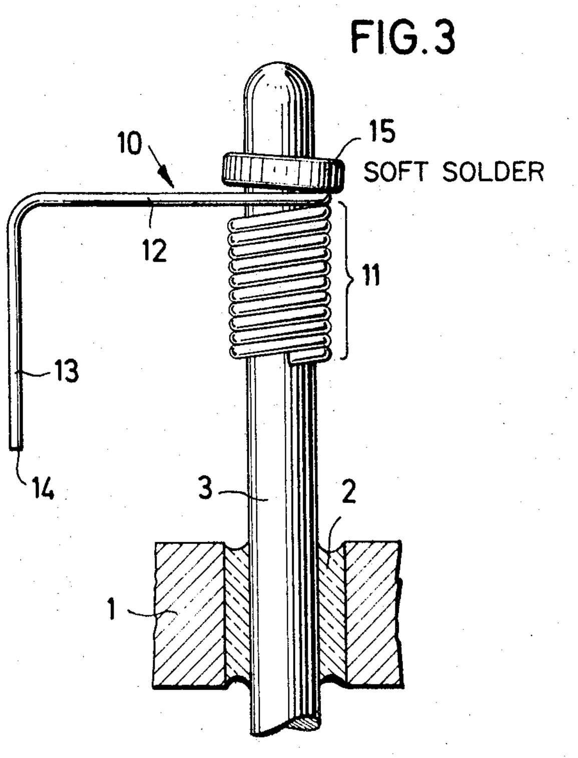
FIG. 3 is an enlarged elevational view of a lead in the transistor of FIG. 1.

As shown in FIG. 3, each lead 10 comprises a helically convoluted end portion 11 whose internal diameter exceeds slightly the diameter of the corresponding terminal (3 or 4), a straight intermediate portion 12 which extends substantially tangentially of and away from the coiled portion 11, and a straight second end portion 13 which is parallel to the straight of the coiled portion 11 and has a free end or tip 14. The portion 11 can be readily formed in a conventional spring winding or coiling machine. It is preferred to form the end portion 13 at the time when the coiled portion 11 is being formed in the coiling machine. The tip 14 is to be soldered to the contact 7 or 8 and the portions 12, 13 preferably make an angle which approximates or equals 90°.

The solder 15 which is needed to bond the coiled portion 11 to the terminal 3 or 4 forms an annulus and is placed on top of the coiled portion 11 when the latter is slipped onto the terminal 3 or 4. The material of the annulus 15 is preferably a soft solder whose melting point is lower than the melting point of solder of the contacts 7, 8 as well as that of the layer of solder 6 (FIG. 2) at the underside of the semiconductor 1. This is desirable because, when the components of the transistor are transported through a soldering furnace, the temperature of components 3, 4, 10 and 15 is somewhat lower by a few percent than that of the semiconductor 1 and the parts carried thereby. This is due to various thermodynamic factors. If the layer 6 and contacts 7, 8 consist of lead-tin solder with a high percentage of lead, the annuli 15 preferably consist of so-called Sn 96 Ag alloy (with additives in the range of as fraction of one percent by weight, such as 0.5 percent Bi or Sb to avoid tin plague) or of Pb 92.5 Sn 5 Ag alloy.

The internal diameter of each annulus 15 exceeds slightly the diameter of the respective terminal 3 or 4 so that such annuli can be readily applied onto the terminals on top of the respective coiled portions 11. The weight of each annulus exerts a relatively small but desirable pressure upon the corresponding lead 10 to urge the tips 14 against the contacts 7, 8.

Figure 2:
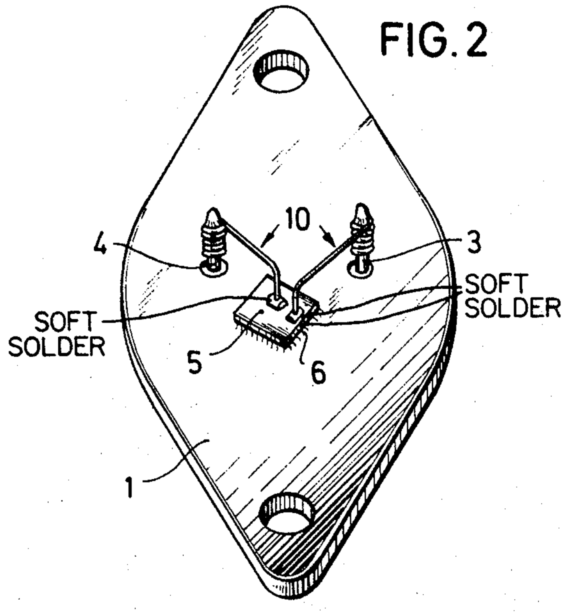
FIG. 2 is a similar perspective view of the fully assembled transistor.

Experiments have shown that the components of the improved transistor can be properly soldered to each other despite unavoidable vibrations which take place when the components are transported through a soldering furnace and that such proper soldering can be achieved without resorting to patterns. This is due in part to the fact that when the material of leads 10 is severed from a greater length of metallic wire, the sharp edges of the tips 14 automatically penetrate into the surfaces of the material of contacts 7, 8 in response to a very small axial pressure upon the end portions 13. Such stabilizing action is further assisted by the relatively high coefficient of friction between the layer 6 and the adjoining surface of the metallic base 1. Thus, even if the soldering operation is carried out without resorting to patterns, the semiconductor 5 is held in requisite position with reference to the base 1 not only due to friction between the base and the layer 6 but also because such friction is enhanced by pressure transmitted to contacts 7, 8 by the tips 14 of the corresponding leads 10. Such friction suffices to prevent shifting of the semiconductor 5 in response to vibrations during transport through the soldering furnace. The soldering operation is preferably carried out in vacuo or in a protective atmosphere of inert gas. When the components travel through the furnace and the material of layer 6 and contacts 7, 8 begins to melt, the semiconductor 5 descends slightly toward the upper side of the base 1 and the coiled portions 11 slide downwardly along the corresponding terminals to insure the formation of a highly satisfactory electrical connection between the end portions 13 and the respective contacts 7 and 8, The tips 14 penetrate into the contacts 7, 8 during travel through the furnace. Each lead 10 can descend by its own weight and due to the weight of the adjoining annulus 15 but independently of the other lead. Prior to melting of contacts 7 and 8, the tip 14 of each lead 10 abuts against the top surface of the corresponding contact and thereby maintains the coiled portion 11 at a predetermined level above the base 1. The annuli 15 melt during travel through the furnace and their material fills the gaps between the terminals 3, 4 and the convolutions of the corresponding coiled portions 11 to form a pair of reliable connectors between the leads and the respective terminals. The fully assembled transistor is shown in FIG. 2.

Figure 4:
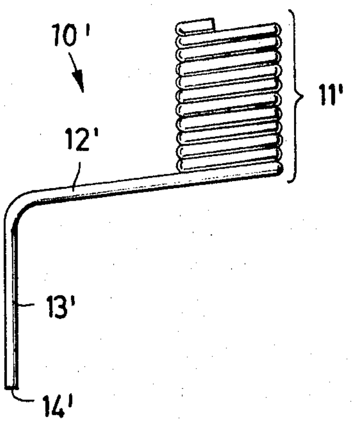
FIG. 4 is an elevational view of a modified lead.

FIG. 4 illustrates a modified lead 10′ having a coiled end portion 11′, an intermediate portion 12′ and a second end portion 13′ with a tip 14′. In this lead, the end portion 13′ is parallel to the common axis of helices which form the coiled portions 11′ but the portions 11′ 13′ extend in opposite directions. This brings about savings in material because the end portion 13′ can be made shorter than the end portion 13 of the lead 10, i.e., the electrical resistance of the lead 10′ is less than that of the lead 10 and the tendency of the lead 10′ to vibrate is also less than that of the lead 10.

The material of annuli 15 is preferably or at least substantially eutectic alloy which may consist of 96 percent by weight of Sn and 4 percent Ag; 96 percent Sn, 4 percent Ag and at least one-tenth of one percent Bi or Sb; or 92.5 percent Pb, 5 percent Sn and 2.5 percent Ag.

If necessary, the free end of the straight end portion 13 or 13′ can be coated with a layer of soft solder prior to applying the could end portion 11 or 11′ of the lead 10 or 10′ around the terminal 3 or 4.

A feature which is common to the leads 10 and 10′ is that they comprise coiled end portions 11, 11′ which can be readily slipped onto pin-shaped terminals or posts, either by automatic machinery or by resorting to semiskilled or unskilled labor. Such assembly can be effected with or without patterns.

Another important feature of the leads 10 or 10′ is that they need not be clamped to terminals 3, 4 prior to soldering. Thus, and since the coiled portions 11 or 11′ surround the terminals 3, 4 with some clearance, each intermediate portion 12 or 12′ can be readily moved to an optimum angular position in which the tip 14 or 14′ of the associated end portion 13 or 13′ bears against a selected part of the contact 7 or 8. If desired, one can employ simple patterns to select in advance the position of the semiconductor 5 with reference to the base 1 prior to soldering and to select the angular position of intermediate portions 12 or 12′ before the components of the transistor are caused to move through the soldering furnace. The leads 10 or 10′ can be fed to the assembling station by way of chutes or by other suitable guide means so that each coiled portion 11 or 11′ automatically descends onto the corresponding terminal 3 or 4 and that each tip 14 or 14′ automatically engages the corresponding contact 7 or 8. If the assembly is carried out by hand, a few simple manipulations suffice to properly mount each lead 10 or 10′ in requisite position for soldering to the semiconductor 5 and terminal 3 or 4.

What I claim as new and desired to be protected by Letters Patent is set forth in the appended claims.

1. As a novel article of manufacture, a semiconductor device comprising a metallic base having a surface; at least one terminal carried by said base and extending beyond said surface; a semiconductor having a first surface adjacent to the surface of said base and a second surface; a first layer of soft solder connecting said first surface to said base; a metallic wirelike lead having a coiled first end portion surrounding said terminal and a substantially straight second end portion which is substantially parallel to the axis of said first end portion and has a free end adjacent to said second surface; a small contact of soft solder on lead basis provided on said second surface and forming a soldering connection between said free end and said second surface; and a connector of soft solder securing said first end portion to said terminal.

2. A semiconductor device as defined in claim 1, wherein the conductivity of said semiconductor in the region of said first surface is opposite that in the region of said second surface.

3. A semiconductor device as defined in claim 1, wherein said semiconductor consists of silicon.

4. A semiconductor device as defined in claim 1, wherein said lead further comprises an intermediate portion which extends substantially at right angles to the axis of said coiled portion.

5. A semiconductor device as defined in claim 1, further comprising insulator means between said terminal and said base.

6. A semiconductor device as defined in claim 1, wherein the internal diameter of said coiled portion exceeds the diameter of said terminal.

7. A semiconductor device as defined in claim 1, wherein said lead is substantially U-shaped and further comprises an intermediate portion which is substantially normal to the axis of said coiled end portion and extends between said end portions.

8. A semiconductor device as defined in claim 1, wherein said lead further comprises an intermediate portion between said end portions and wherein said end portions extend from opposite sides of said intermediate portion.

9. A semiconductor device as defined in claim 1, wherein said layer, said contact and said connection consist of lead-tin solder with a melting point above 280° C. and wherein the melting point of the solder of said connection is lower than the melting point of the solder of said contact and said layer.

10. A semiconductor device as defined in claim 1, wherein the solder of said connector is or at least substantially eutectic alloy selected from the group consisting of a. 96 percent by weight of Sn and 4 percent by weight of Ag.

b. 96 percent by weight of Sn, 4 percent by weight of Ag and at least one-tenth of one percent by weight of Bi or Sb.